United States Patent [19]

Polese et al.

[11] Patent Number: 5,886,407
[45] Date of Patent: Mar. 23, 1999

[54] HEAT-DISSIPATING PACKAGE FOR MICROCIRCUIT DEVICES

[75] Inventors: Frank J. Polese, 4421 Granger St., San Diego, Calif. 92126; Vladimir Ocheretyansky, Santee, Calif.

[73] Assignee: Frank J. Polese, San Diego, Calif.

[21] Appl. No.: 654,974

[22] Filed: May 28, 1996

Related U.S. Application Data

[63] Continuation-in-part of Ser. No. 459,700, Jun. 2, 1995, abandoned, which is a continuation-in-part of PCT/US94/04814 May 9, 1994, which is a continuation of Ser. No. 64,255, May 20, 1993, Pat. No. 5,413,751, which is a continuation of Ser. No. 46,635, Apr. 14, 1993, abandoned.

[51] Int. Cl.$^6$ .................................................. H01L 23/10
[52] U.S. Cl. ........................ 257/706; 257/720; 257/712
[58] Field of Search .................................. 257/706, 720, 257/747, 712

[56] References Cited

U.S. PATENT DOCUMENTS

| | | | |
|---|---|---|---|
| 2,971,251 | 2/1961 | Willemse | 257/747 |
| 4,025,997 | 5/1977 | Gernitis et al. | 257/747 |
| 4,074,342 | 2/1978 | Honn et al. | 257/747 |
| 4,227,036 | 10/1980 | Fitzgerld | 257/747 |
| 4,361,720 | 11/1982 | Resneau | 257/747 |
| 4,602,314 | 7/1986 | Broadbent | 257/747 |
| 4,680,618 | 7/1987 | Kuroda et al. | 257/747 |
| 4,788,627 | 11/1988 | Ehlert et al. | 257/747 |
| 4,965,659 | 10/1990 | Sasame et al. | 257/720 |
| 4,994,903 | 2/1991 | Wroe et al. | 257/747 |
| 5,043,796 | 8/1991 | Lester | 257/747 |
| 5,050,040 | 9/1991 | Gondusky et al. | 257/720 |
| 5,086,333 | 2/1992 | Osada et al. | 257/747 |
| 5,151,777 | 9/1992 | Akin et al. | 257/720 |

*Primary Examiner*—Olik Chaudhuri
*Assistant Examiner*—Nathan Kelley
*Attorney, Agent, or Firm*—Henri J. A. Charmasson; John D. Buchaca

[57] ABSTRACT

High density heatsinks for microcircuit packages are formed by first mold-pressing a composite powder of free-flowing spray-dried particles of an inexpensive high thermal conductivity material having a high coefficient of thermal expansion (CTE) such as copper and at least one other low CTE material such as tungsten, the proportions of which are adjusted to match the CTE of the microcircuit material. The pressed compacts are sintered in order to achieve an homogeneous distribution of the melting copper throughout the structure. A multilevel embodiment of the heatsink comprises two bonded layers of metals or composites having their coefficients of thermal expansion adjusted to match those of the semiconductor material and of any supporting structures respectively, wherein the second layer in contact with the supporting structure has a high CTE and the other has a lower CTE. Another embodiment provides for bonding a composite heatsink to a high thermal conductivity pedestal which mounts the microcircuit device, using sintering to shrink an aperture engaged by the pedestal.

10 Claims, 4 Drawing Sheets

HEAT-DISSIPATING PACKAGE FOR MICROCIRCUIT DEVICES

PRIOR APPLICATION

This is a continuation-in-part of Application Ser. No. 08/459,700 filed Jun. 2, 1995 now abandoned, a continuation-in-part of PCT/US94/04814 filed May 9, 1994, a continuation of Ser. No. 064,255 filed May 20, 1993 now U.S. Pat. No. 5,413,751 dated May 9, 1995 which was a continuation-in-part of Ser. No. 046,635 filed Apr. 14, 1993, now abandoned.

FIELD OF THE INVENTION

The instant invention relates to powder metallurgy and to the fabrication of micro-electronic packages, and more specifically to the manufacture of heat-dissipating elements having a coefficient of expansion compatible with the material used in the fabrication of microcircuits.

BACKGROUND OF THE INVENTION

The fabrication of electronic microcircuits requires the use of substrates, heatsinks, electrodes, leads, connectors, packaging structures and other components capable of dissipating the heat generated by the active parts of the microcircuit or by the soldering, brazing or glass-sealing process. Moreover, those components that are in direct contact with the active microcircuit sections must have a coefficient of thermal expansion ("CTE") compatible with gallium arsenide, silicon, germanium or any material used in the fabrication of the microcircuit.

Materials such as copper, silver, gold and aluminum which exhibit high coefficient of thermal conductivity tends also to have CTEs much higher than materials such as gallium arsenide alumina or polysilicon which are used in the implementation microcircuit elements or their enclosures.

As disclosed in U.S. Pat. No. 4,680,618 Kuroda et al., it has been found convenient to use composites of copper and other denser metals such as tungsten or molybdenum in the fabrication of heatsinks, substrates and other heat-dissipating elements of microcircuits. The proportions of the metals in the composite are designed to match the CTE of the material used in the fabrication of the active circuit component.

The CTE of a metal is defined as the ratio of the change in length per degree Celsius to the length. It is usually given as an average value over a range of temperatures. Metal used in electrical conductors such as aluminum, copper, silver and gold that have a low electrical resistivity also exhibit high coefficients of thermal conductivity. The coefficient K of thermal conductivity of a material is defined as the time rate of heat transfer through unit thickness, across unit area, for a unit difference in temperature or $K=WL/A\,T$ where W=watts, L=thickness in meters, a=area in square meters, and T=temperature difference in °K or °C. For copper, K is equal to 388. For silver, K is equal to 419. However, these metals exhibit an average CTE in excess of $15\times10^{-6}/°C$. By contrast, material such as gallium arsenide and silicon, that are commonly used in the manufacture of microcircuit chips have an average CTE of less than $7\times10^{-6}/°C$. Thus, while material of high electrical and thermal conductivity are favored in the fabrication of heat-dissipating electric elements, they must be blended with conductive material exhibiting a much lower average CTE in order to create a composite whose thermal expansion characteristic comes as close as practically possible to that of gallium arsenide, silicon and other micro-chip materials. Tungsten and molybdenum with average CTE of $4.6\times10^{-6}/°C$. and $6\times10^{-6}/°C$. and coefficient of thermal conductivity of 160 and 146 respectively are favored.

However, while copper, aluminum, and silver have specific gravities of less than 9, and melting point of less than 1,100° C., tungsten and molybdenum have specific gravities of 19.3 and 10.2, and melting points of 3,370° C. and 2,630° C. respectively.

Due to the large differences in the specific gravities and melting-points, and lack of mutual solubility of metals such as copper and tungsten, for example, it is difficult to form composites of those two metals that exhibit a reliable degree of homogeneity using conventional melting processes.

As disclosed in U.S. Pat. No. 5,086,333 Osada et al., it has been found more practical to press and sinter a powder of the most dense materials, e.g., tungsten, to form a porous compact, then to infiltrate the compact with molten copper or another lighter material. A slab of the resulting material can then be cut and machined to form heatsinks, connectors, substrates and other heat-dissipating elements.

The heat-dissipating base upon which micro-chips are mounted must also be attached to packaging or frame member usually made of ceramic or other material having a different CTE than the semiconductor material of the micro-chip and of the heat-dissipating base. Thermal stress between the heat-dissipating base and the frame member may cause cracks or camber after joining operation in the latter stage. The problem has been addressed in the prior art by using a intermediate heat-dissipating member whose composition and CTE continuously vary from one contact to the other as disclosed in U.S. Pat. No. 3,097,329 Siemens.

Another approach disclosed in U.S. Pat. No. 4,427,993 Fichot et al. consists of embedding a lattice of CTE-modifying material into one of the contact surfaces of the heat-dissipating element.

Both of these approaches are, complex and onerous and do not allow a precise control of the CTEs at one or both interfacing areas of the heat-dissipating member.

The costs of metals such as tungsten and molybdenum are relatively high compared to the costs of copper, aluminum and other more abundant metals. Heat-dissipating components made of composites in which a costly metal such as tungsten is used for CTE-matching purpose tend to be expensive. As the power ratings of micro-electronic modules increase, bigger heat-dissipating substrates are required. The cost associated with the substrates being dictated by the cost of their base metals remains inflexibly high while the costs of the microcircuit can be controlled and even reduced through the use of new technological improvements. The problem of substrate-related costs is particularly acute in microwave power devices where large and elaborate heatsinks must be used. In many cases, the costs of the heat-dissipating component represent a large percentage of the total device. Accordingly, there is a need for a more economical way to construct heat-dissipating substrates for high-power micro-electric modules.

The instant invention results from an attempt to devise a simpler, more practical and more economical process to manufacture such heat-dissipating components using powder and other metallurgy techniques. The invention is based in part on the techniques and processes disclosed in the parent application, Ser. No. 08/064,255 which issued as U.S. Pat. No. 5,413,751 dated May 9, 1995, which application and patent are hereby incorporated in this Specification by reference.

SUMMARY OF THE INVENTION

A principal object of the invention are to provide a practical and more economical process to form heatsinks and other heat-dissipating elements of microcircuit devices from composites combining a material having a high coefficient of heat dissipation and thermal expansion with another metal of lower thermal expansion characteristics, where the composite is homogeneous, maintains a low-porosity (less than 5%), and can be formulated to exhibit a desired coefficient of thermal expansion while at the same time reducing or eliminating some of the machining and other finalizing steps.

It is also an object of this invention to provide a simple, practical and precise method for independently adjusting the CTEs of various surface zones of a single heat-dissipating substrate in microcircuit packages.

Another object of this invention is to reduce the cost of heat-sink substrates in power devices by combining large heat-sink elements made of inexpensive metals with smaller layers of CTE-matching composites.

These and other objects are achieved by press-forming desired CTE-matching components from composite powders, then mounting them on larger copper heat-sinks.

DESCRIPTION OF THE PREFERRED EMBODIMENTS OF THE INVENTION

Figure 1:
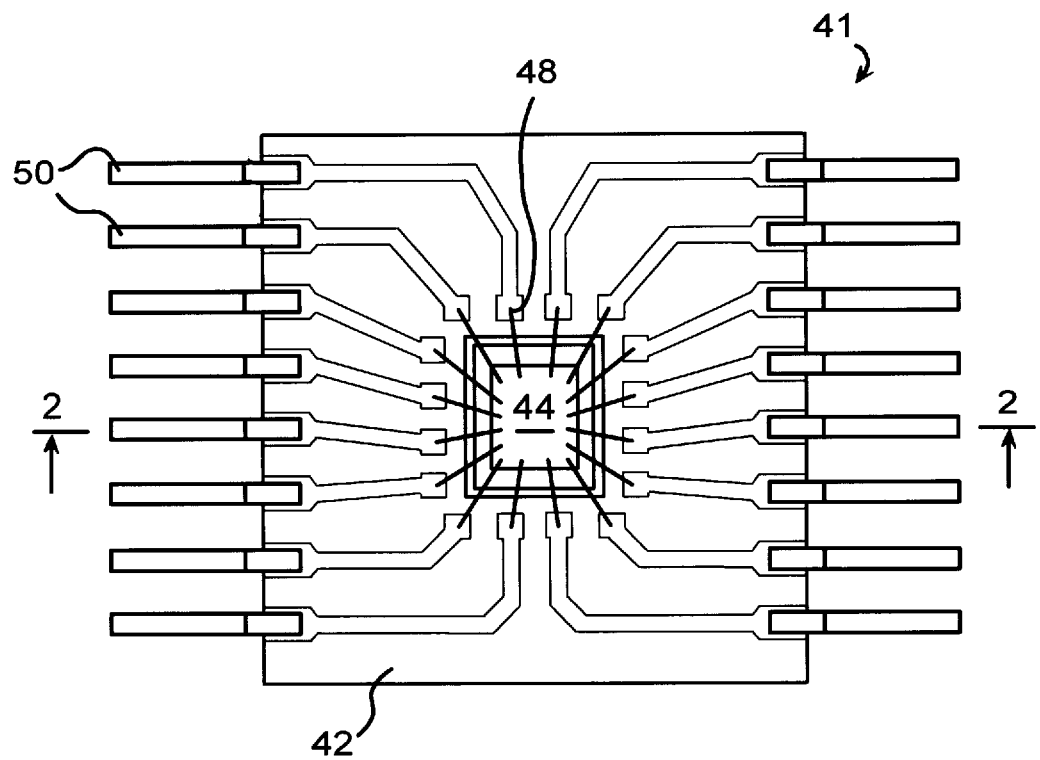
FIG. 1 is a top plan view of a microcircuit device package of the invention prior to any encapsulation.
Figure 2:
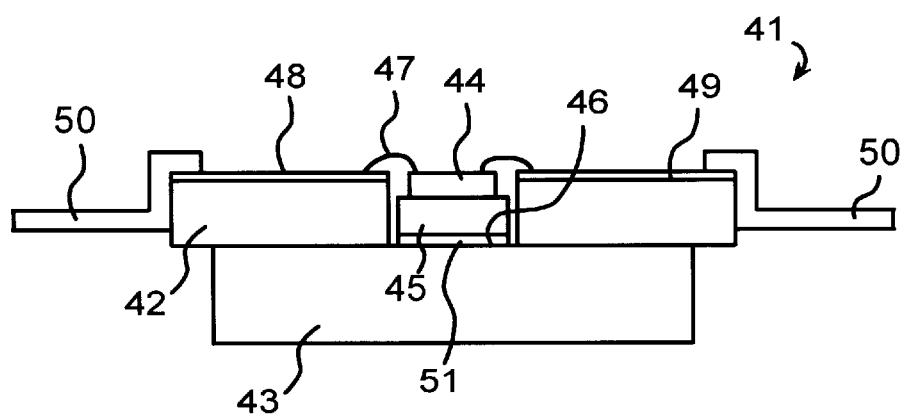
FIG. 2 is a cross-sectional view taken along line 2—2 of FIG. 1.
Figure 3:
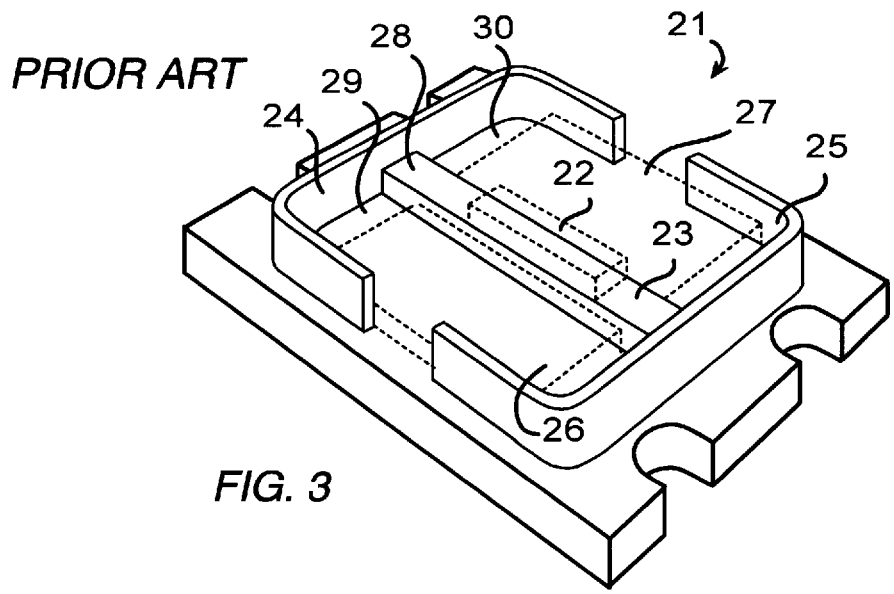
FIG. 3 is a perspective view of a microwave power device heat-sink of the prior art.

A first preferred embodiment of the processes of the invention will be described in connection with the fabrication of heatsinks used in microelectronic devices. The same process may be used in making other articles of manufacture requiring a combination of metals of substantially different specific gravities and/or melting temperatures.

In this specification, the term "high thermal conductivity" is meant to include those materials that have a coefficient of thermal conductivity in excess of 150.

Similarly, with respect to coefficients of thermal expansion, those materials having a CTE below approximately $8 \times 10^{-6}/°C$. will be said to have a "low" CTE. Those materials having a CTE above approximately $12 \times 10^{-6}/°C$. will be said to have a "high" CTE.

A mixture of particles of at least one material, composite or alloy having an average coefficient of thermal conductivity above 200, and at least one second material, composite or alloy having an average coefficient of thermal expansion of less than $7 \times 10^{-6}/°C$. is press-molded at room temperature into compacts in the shape of the desired heatsinks using a pressure that does not exceed 6,804 atmospheres (100,000 psi).

The first material, composite or alloy is preferably selected from a group consisting of aluminum, copper, tin, lead, germanium, gold and silver, and composites and alloys thereof. The second metal composite or alloy is preferably selected from a group consisting of tungsten, molybdenum and carbon, and composites and alloys thereof.

Particles of other metals such as cobalt and nickel can also be added to the mixture to achieve particular CTE and other desired characteristics.

The metal particles may have been formed by techniques well-known to those skilled in powder metallurgy, such as by chemical reduction of the oxide form of the metal. It has been found that the homogeneity of the final composite may be improved by using a free-flowing powder mixture of pre-clustered particles of the different density metals. Free-flowing powder refers to those powders which flow unaided through a Hall flow-meter funnel having an orifice of 2.54 millimeters (0.1 inch) as specified under standards published by the Metal Powder Industries Federation (MPIF). Such pre-clustering may be accomplished by using spray-dry powders. Pre-clustered mixtures may be obtained through other methods resulting in a temporary bond between particles of different densities. The bond must be relatively weak so as to be broken under the pressure applied to the press-mold in order to form a more homogeneous compact having pore sizes comparable with particle sizes.

The compacts are then placed in a furnace and sintered at a temperature sufficient to melt the material having the lowest melting point and the lowest specific gravity. As the particles of the latter, typically copper, melt, the fluid metal phase forms a film surrounding the solid phase, typically the tungsten or molybdenum particles, providing a good wetting condition. The formation of the melted metal liquid film and the use of fine particles of tungsten, molybdenum or carbon enhance the surface tension that acts as the principal mechanism yielding a higher densification and pore reduction. Nearly equivalent results can be achieved by not allowing the particles of metal having the lowest melting point to melt completely but to soften enough to deform and adhere to the other particles. The sintering of the described compacts shows a shrinkage of about 15% that characterizes the above-described fabrication of final composite blocks having the shape of the desired heatsinks without need of any extensive cutting, stamping or machining. Therefore, the process results in a readily usable, inexpensive component having good thermal conductivity and matched thermal expansion characteristics.

EXAMPLE

A copper and tungsten powder was selected that contained approximately 15 percent copper and 85 percent tungsten by weight (27.7 percent and 72.3 per volume). The powder mixture consisted of metal particles with average diameter of less than 2 microns in diameter. The mixture had been spray-dried and treated to form homogeneous and lightly-bound agglomerates of tungsten and copper particles in nodules with an average diameter of 200 microns. Such a powder mixture is manufactured by Sylvania of Towanda, Penn. according to the inventors' specifications disclosed herein.

The mixture was press-molded at room temperature under 3,740 atmospheres (55,000 lbs/in$^2$) into the final 1.9 cms×

1.9 cms×0.20 cms shapes of the desired heatsinks for microelectronic assemblies. The resulting "green" compacts were placed in a sintering furnace and subjected to a temperature of 1,100° C. to 1,350° C. for one hundred twenty minutes.

After cooling, the final articles exhibited a specific gravity of 16.15, as compared to the 16.41 gravity that would result from a perfectly solid composite, i.e., slightly over 98% of theoretical density of a similarly proportioned alloy.

Observation under 1,000× magnification of the products manufactured according to this example, and similar products manufactured by press-molding of the tungsten powder alone and subsequent infiltration by melted copper shows that the invention resulted in substantially finer distribution of the copper, improved homogeneity, and lower porosity of the final material.

Other compositions with tungsten to copper ratios of 80/20 through 90/10 were similarly fabricated that exhibited coefficients of thermal expansion ranging from 6.5 to $8 \times 10^{-6}/°C$. sufficient to match the thermal expansion coefficient of gallium arsenide, $Al_2O_3$ and other materials used in the fabrication of microelectronic packages, while retaining coefficient of thermal conductivity between 140 and 200 W/m°K.

An application of the above-described sintering process to the manufacture of heat-dissipating substrate elements in microcircuit devices will now be described with reference to the drawing.

The microcircuit device 41 comprises an electrical interconnect support structure 42 made of layers of relatively inexpensive dielectric material such as polyamid or other polymer dielectrics, or epoxy having a high CTE. The support structure supports a heat-dissipating substrate or base 43 made of relatively inexpensive materials having a high overall thermal conductivity coefficient and a high CTE, such as copper or aluminum. Other inexpensive materials having a low thermal conductivity but relatively high CTE suchas FR4 epoxy may also be suitable for the support structure.

A micro-chip or die 44 is supported by a pedestal 45 rising from the upper surface 46 of the substrate 43. The pedestal 45 is manufactured separately from the substrate 43 then bonded to the substrate either by brazing, resistance welding, ultrasonic welding, pressing, i.e., cold diffusion under high pressure, or, with a use of an interim layer 51 of thermally conductive polymer adhesive containing metal particles. Alternatively, the interim layer can be a sheet of copper, aluminum, silver, gold or any alloy of those metals no thicker than 500 microns, not including distortion that may be caused by the brazing or welding process, inserted between the pedestal 45 and the substrate. This sheet can either be brazed, welded or bonded by adhesive to the substrate 43, to the pedestal 45, or to both.

A series of wire-bonds 47 connect contact points on the die to metalization 48 patterned onto the surface 49 or within the body of the support structure 42. The metalization connects to a plurality of leads 50 extending from the structure 42.

In order to distribute and reduce the mechanical stress at the junction of the various components of the device, the components are made of materials having CTEs which are compatible with the CTEs of materials used in adjacent contacting components. Accordingly, the bulk of the substrate 43 has a CTE comparable with the CTE of the dielectric support structure 42, while the pedestal 45 has a CTE chosen or adjusted according to the above described process, to be substantially thermally compatible with the semiconductor material of the chip 44 it contacts and supports.

It should be understood that the CTEs of two adjacent components do not have to be matched exactly, but need only to be substantially compatible or close enough to avoid camber or fracture or separation of the layers due to the respective expansion of the components over a change of temperature range of approximately 200° C., typically from −55° C. to +200° C. For example, the 24 CTE of an aluminum substrate 43 is thermally compatible with the 24 CTE of a polyamid or epoxy support structure 42. The CTE of the pedestal 45 is adjusted to be thermally compatible with the 4.2 CTE of the silicon used in the die 44. Adjustment of the pedestal CTE can be accomplished by selecting a material such as tungsten-copper with a 6.0 CTE. Other candidates for the pedestal material are molybdenum-copper, graphite-copper, graphite-aluminum, aluminum silicon carbide or composites thereof, or other low expansion, high thermal conductivity material.

The embodiment of the invention described below is intended to yield a low cost heat-dissipating substrate for use in power micro-electronic devices such as microwave amplifiers. A typical prior art heat-sink 21 used in connection with a microwave power amplifier is cast or machined from a composite typically manufactured by powder metallurgy process. The microcircuit elements shown in dotted line comprise a power amplifier 22 mounted on a rib 23 spanning the center of the heat-sink. The rib divides the upper surface of the heat-sink into two cavities 24, 25 which are shaped and dimensioned to nest an input receiver 26 and an output transmitter 27 respectively. The amplifier 22 is typically a gallium-arsenide (GaAs) Field Effect Transistor mounted directly on the upper surface 28 of the rib 23 for maximum heat-dissipation. The input and output modules 26, 27 are typically hybrid microcircuits having their bottom surface bonded to the floors 29,30 of the cavities 24, 25. The composite material of the heat-sink has a CTE which has been adjusted by appropriate apportionment of its powder components to substantially match the CTE of the GaAs in the amplifier 22. The composite typically includes tungsten, molybdenum and other relatively costly metals.

Figure 4:
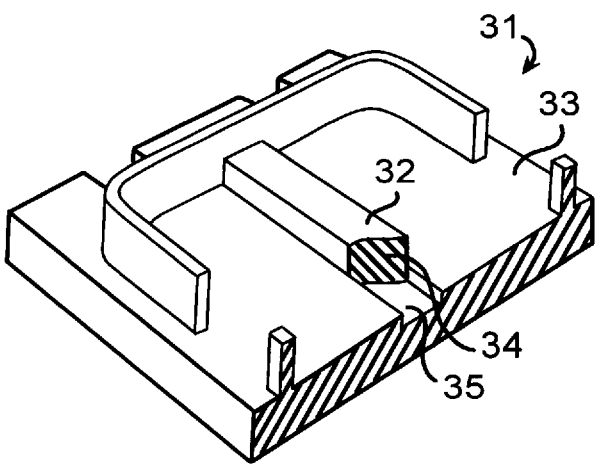
FIG. 4 is a median cross-sectional view of an improved heat-sink according to the invention.

In the similar, but improved heat-sink 31 illustrated in FIG. 4, only the amplifier-supporting rib or pedestal 32 is cast or machined from a CTE-matching composite while a slab 33 corresponding to the bulk of the heat-sink 31 is made from a more abundant material such as copper or aluminum or an alloy thereof having a very high heat-transfer characteristic.

Preferably, the amplifier-supporting rib or pedestal 32 has its lower portion 34 nested into a slot 35 formed into the upper surface of the copper or aluminum slab 33.

The bonding between the pedestal 32 and the slab 33 is preferably done by welding, brazing or in accordance with one of the bonding techniques disclosed in connection with the earlier described embodiments of the invention. The bond must be able to withstand temperatures of 150 degrees Celsius (approximately 300 degrees F.) which can be generated in this type of power devices. Accordingly, any brazing material, solder or adhesive must have a melting temperature in excess of 180 degrees Celsius (approximately 350 degrees F.). This technique of using a relatively expensive CTE-matching composite pedestal on the portion of the heat-sink in direct contact with the transistor or other microcircuit elements from which heat has to be drained, can be applied to laser diodes and other high power components.

Due to the small amount of CTE-matching material used in forming the pedestal, relatively expensive materials such as composites formed by powder-metallurgy techniques are available, such as combinations of copper or aluminum, with tungsten, molybdenum, or graphite. This also allows the use of diamond, diamond composites or other expensive materials with a very high heat-transfer capability to be used more economically.

It should be noted that if resistance welding is used to bond the rib to the slab, there may be some deformation of the rib-to-slab interface and some metal splattering on adjacent surfaces. The splatter and deformation may be removed by machining the heat-sink after welding is completed. This, of course, may require minor modification of the structures to accommodate the removal of material during later machining.

Figure 5:
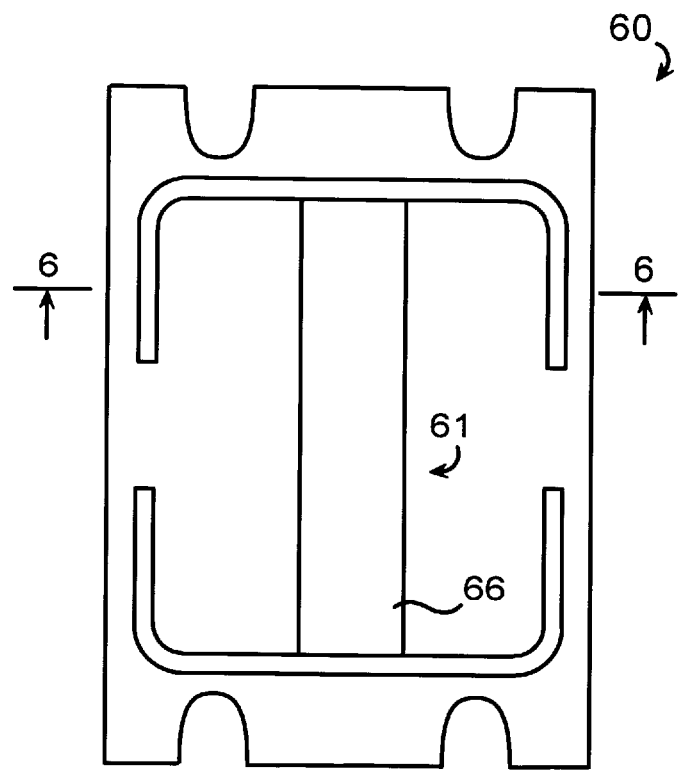
FIG. 5 is a top plan view of a microwave power device heat-dissipating package according to another embodiment of the invention. 4
Figure 6:
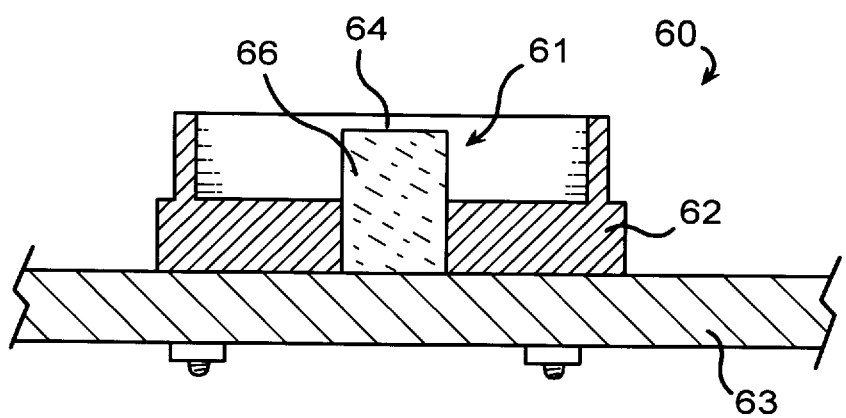
FIG. 6 is a cross-sectional view taken along line 6—6 of the package of FIG. 5 as attached to a support housing.

In an alternate embodiment 60 of the power microcircuit heat-dissipating package, shown in FIGS. 5–6, a high thermal conductivity amplifier-supporting pedestal 61 extends through the slab 62 to contact the housing 63 to which the heat-sink is attached during operation. This arrangement is particularly suited to applications involving particularly high heat producing chips or those requiring especially efficient heat conductivity.

As in the previous embodiment, the pedestal 61 is formed from materials such that its upper surface 64 has a CTE substantially matching that of the mounting surface of the amplifier.

For example, for a GaAs amplifier, the pedestal 61 is made of high thermal conductivity, low expansion material such as diamond, graphite, or other high thermal conductivity carbon, or a graphite-metal composite, such as graphite-aluminum or graphite-copper, or aluminum-silicon carbide type material. The slab 62 is made from relatively less expensive low expansion material such as copper-tungsten, copper-molybdenum or a graphite-metal composite.

By extending the pedestal 61 through the slab 62, heat is transferred more directly to the high heat capacity housing 63 rather than through the slab. Indeed, full advantage is not taken of the high conductivity of a pedestal made from diamond when heat must first transfer to a less heat conductive or heat capacitive slab.

Figure 7:
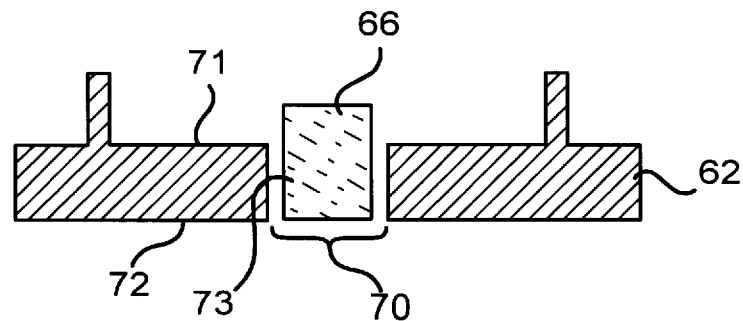
FIG. 7 is a cross sectional end view of an in-process microwave power device heat-dissipating package according to an embodiment of the invention prior to sintering.
Figure 8:
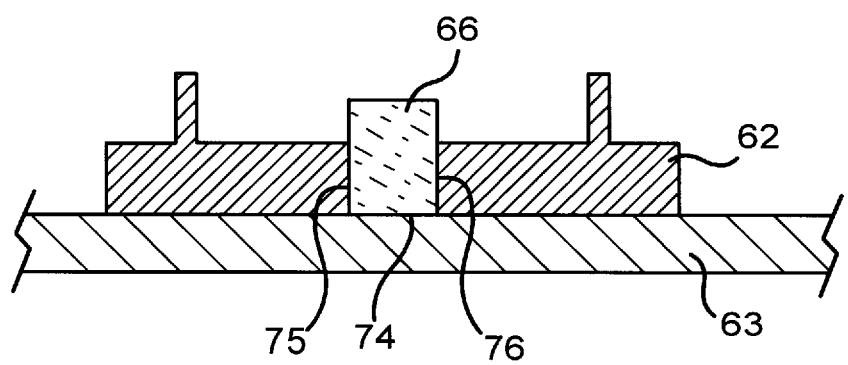
FIG. 8 is the package of FIG. 7 after sintering.

Referring now to FIGS. 7–8, an alternate embodiment of the process for manufacturing the power microelectronic device heat-sink is shown. The heat-sink slab is manufactured according to the above described powdered metallurgical process wherein sintering causes a shrinkage in the slab. In its pre-sintered state, as shown in FIG. 7, the slab 62 has a central aperture 70 extending from an upper surface 71 of the slab to a bottom surface 72 of the slab. The aperture is sized to allow for the insertion of a portion 73 of the pedestal 66 into the aperture. If the pedestal 66 is metalized, it may be bonded to the slab 62 by sintering the slab while the pedestal is engaged in the aperture 70. The sintering causes the compact material comprising the slab to shrink, thereby reducing the size of the aperture to the point where in contacts the walls 75,76 of the portion of the pedestal engaged within the aperture, thereby hermetically bonding the pedestal in place.

The pedestal is positioned within the aperture such that a lower surface 74 is exposed for contact to the heat capacitive mounting housing 63.

While the preferred embodiments of the invention has been described, modifications can be made and other embodiments may be devised without departing from the spirit of the invention and the scope of the appended claims.

What is claimed is:

1. In a microcircuit power device which comprises a Field Effect Transistor (FET), input and output transmission components mounted together on a heat-dissipating substrate, an improvement comprising:

a heat-dissipating substrate including a slab made of a material having a first CTE a trench extending downward from an upper surface of said slab;

a sidewall defining a lateral extent of said trench;

a pedestal having a portion nested within said trench;

said sidewall contacting said pedestal;

said pedestal having a first surface shaped and dimensioned to support said FET;

said pedestal being made from a second material having a second CTE lower than said first CTE.

2. The improvement of claim 1, wherein said first material is selected from the group consisting of:

copper, aluminum and alloys thereof; and said slab having mounting areas shaped and dimensioned to support said transmission components.

3. The improvement of claim 2, wherein said trench is positioned between said mounting areas.

4. The package of claim 1, wherein said pedestal is bonded to said slab by resistive welding.

5. The improvement of claim 1, wherein said trench extends through to a bottom surface of said slab; and wherein said pedestal has a second lower surface exposed to contact from below by structures not comprising said pack.

6. The improvement of claim 1, wherein said portion of said pedestal extends through said slab.

7. A package for mounting a microcircuit electronic device which comprises:

a heat-dissipating substrate including a slab made from a first material having a first CTE;

a heat-conducting pedestal for mounting said device;

said pedestal being made from a second material having a second CTE lower than said first CTE;

a trench extending downward from an upper surface of said slab;

said pedestal having a portion nested within said trench;

said slab comprising a sidewall defining a lateral extent of said trench; and said sidewall contacting said pedestal.

8. The package of claim 7, wherein said trench extends through to a bottom surface of said slab, thereby exposing a lower surface of said pedestal to contact from below by structures not comprises said package.

9. The package of claim 7, wherein said second material is selected from the group consisting of tungsten-copper, molybdenum-copper, graphite-copper, graphite-aluminum, aluminum silicon carbide, and diamond.

10. The package of claim 7, which further comprises an bonding material layer sandwiched between said sidewall and said pedestal.

* * * * *